(12) United States Patent
Nettesheim et al.

(10) Patent No.: US 12,102,009 B2
(45) Date of Patent: Sep. 24, 2024

(54) DEVICE HAVING AN ELECTRO-CERAMIC COMPONENT

(71) Applicants: Relyon Plasma GmbH, Regensburg (DE); TDK Electronics AG, Munich (DE)

(72) Inventors: Stefan Nettesheim, Regensburg (DE); Klaus Forster, Bad Abbach (DE); Markus Puff, Graz (AT); Johann Pichler, Breitenau am Hochlantsch (AT)

(73) Assignees: Relyon plasma GmbH, Regensburg (DE); TDK Electronics AG, Munich (DE)

( * ) Notice: Subject to any disclaimer, the term of this patent is extended or adjusted under 35 U.S.C. 154(b) by 903 days.

(21) Appl. No.: 17/112,402

(22) Filed: Dec. 4, 2020

(65) Prior Publication Data

US 2021/0111331 A1 Apr. 15, 2021

Related U.S. Application Data

(63) Continuation of application No. PCT/IB2019/053964, filed on May 14, 2019.

(30) Foreign Application Priority Data

Jun. 4, 2018 (DE) ..................... 10 2018 113 190.9

(51) Int. Cl.
*H01L 41/053* (2006.01)
*H01G 4/12* (2006.01)
(Continued)

(52) U.S. Cl.
CPC ............. *H10N 30/883* (2023.02); *H01G 4/12* (2013.01); *H01G 4/224* (2013.01); *H01G 4/40* (2013.01); *H10N 30/40* (2023.02)

(58) Field of Classification Search
CPC ....... H10N 30/883; H10N 30/40; H10N 30/88
(Continued)

(56) References Cited

U.S. PATENT DOCUMENTS 2,830,274 A 4/1958 Rosen et al.
6,052,300 A 4/2000 Bishop et al.
(Continued)

FOREIGN PATENT DOCUMENTS

DE 39 27 406 A1 2/1991
DE 102 25 408 A1 12/2003
(Continued)

*Primary Examiner* — Derek J Rosenau
(74) *Attorney, Agent, or Firm* — Simpson & Simpson, PLLC

(57) ABSTRACT

A device (1) comprising an electro-ceramic component (2) which has a first electrical contact (3A), provided on a first side face (2A) of the electro-ceramic component (2) in the excitation zone (11), and a second electrical contact (3B) provided on a second side face (2B) of the electro-ceramic component (2). A sealing compound (20) is placed around the electro-ceramic component (2) so that the first electrical contact (3A) and the second electrical contact (3B) are covered by the sealing compound (20) and a free end (26) of a section (24) of the high-voltage zone (12) of the electro-ceramic component (2) projects beyond a free end (22) of the sealing compound (20).

18 Claims, 5 Drawing Sheets

(51) Int. Cl.
*H01G 4/224* (2006.01)
*H01G 4/40* (2006.01)
*H10N 30/40* (2023.01)
*H10N 30/88* (2023.01)

(58) Field of Classification Search
USPC .............................. 310/319, 340, 344, 348
See application file for complete search history.

(56) References Cited

U.S. PATENT DOCUMENTS

| | | |
|---|---|---|
| 9,788,404 B2 | 10/2017 | Nettesheim et al. |
| 2010/0090332 A1 | 4/2010 | Kim et al. |
| 2011/0316388 A1* | 12/2011 | Akiyama ............ G10K 11/025 |
| | | 310/334 |
| 2013/0285509 A1 | 10/2013 | Kreiter et al. |
| 2017/0208675 A1* | 7/2017 | Doellgast ............. H10N 30/883 |
| 2018/0375013 A1 | 12/2018 | Weilguni et al. |

FOREIGN PATENT DOCUMENTS

| | | |
|---|---|---|
| DE | 10 2013 100 617 B4 | 8/2016 |
| DE | 10 2015 120 160 A1 | 5/2017 |
| EP | 0 814 518 B1 | 12/1997 |
| EP | 0 847 093 A1 | 10/1998 |
| EP | 0 890 999 A1 | 1/1999 |
| EP | 1 030 381 B1 | 6/1999 |
| JP | H 08-125247 A | 5/1996 |
| JP | H08217410 A | 8/1996 |
| JP | 2000-164384 A | 6/2000 |
| JP | 2011-002269 A | 1/2011 |
| JP | 2013197531 A | 9/2013 |
| JP | 2016-510483 A | 4/2016 |
| WO | 2012/069235 A1 | 5/2012 |

* cited by examiner

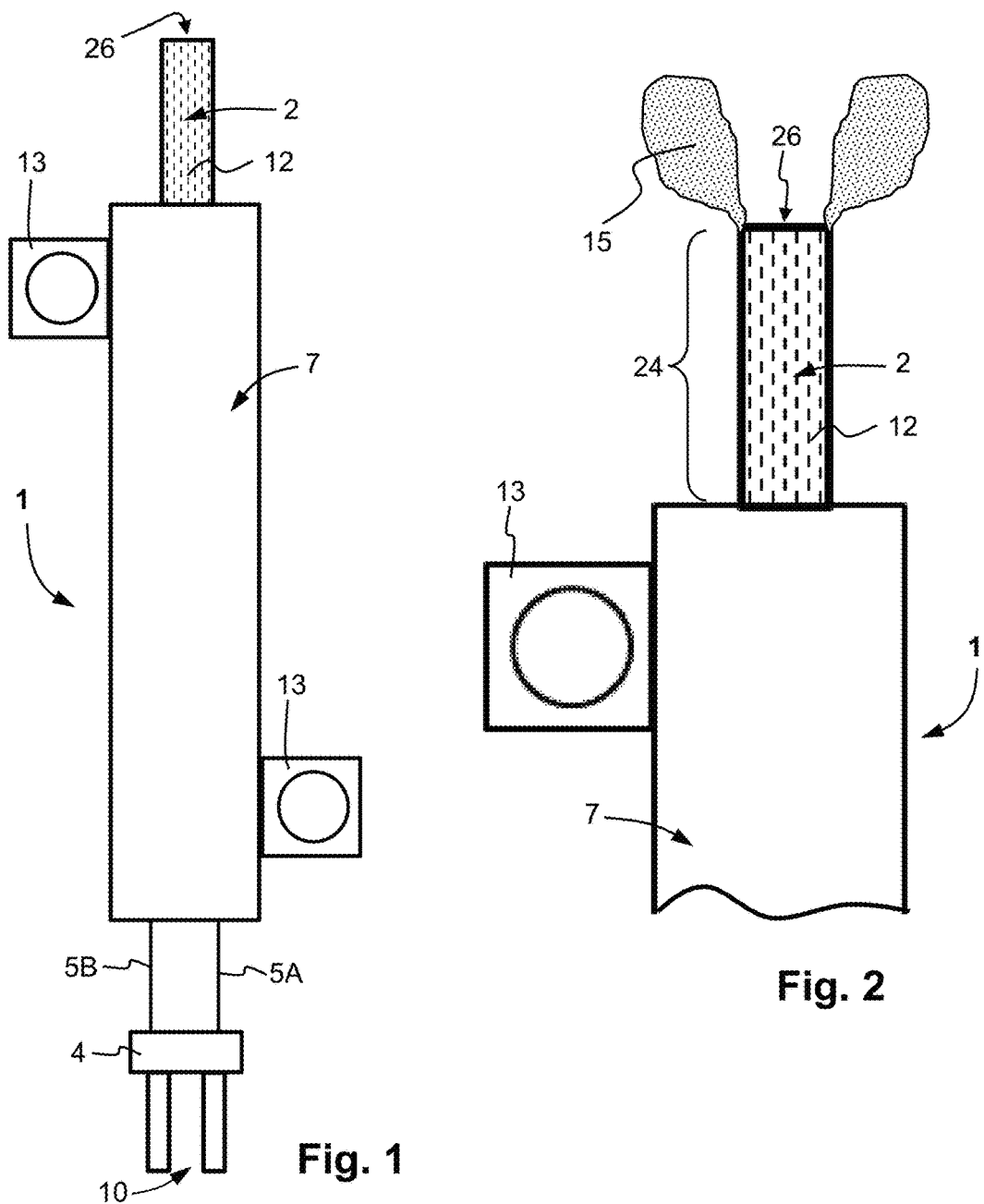

DEVICE HAVING AN ELECTRO-CERAMIC COMPONENT

CROSS-REFERENCE TO RELATATED APPLICATIONS

The present application is filed under 35 U.S.C. §§ 111(a) and 365(c) as a continuation of International Patent Application No. PCT/IB2019/053964, filed on May 14, 2019, which application claims priority from German Patent Application No. DE 102018113190.9, filed on Jun. 4, 2018, which applications are incorporated herein by reference in their entireties.

FIELD OF THE INVENTION

The present invention relates to a device with an electro-ceramic component. The present invention relates in particular to a device with an electro-ceramic component which has a first electrical contact which is provided on a first side face of the electro-ceramic component. A second electrical contact is provided on a second side face of the electro-ceramic component.

BACKGROUND OF THE INVENTION

Electro-ceramic components, for example piezoelectric transformers (PT), are known from the prior art, for example from U.S. Pat. No. 2,830,274 A from 1958 according to Charles A. Rosen. A piezoelectric transformer is an electro-mechanical resonance transformer that uses a combination of the inverse piezo effect (excitation) and direct piezo effect (voltage generation) to convert an input voltage with a given transformation ratio into an output voltage. Frequency and transmission ratio are determined by the dimensions and the electromechanical material properties. Typically, piezoelectric transformers are operated with an electrical driver module which applies electrical excitation in a suitable resonance mode. Areas of application are, for example, in the generation of high voltage for the supply of fluorescent tubes. Piezoelectric transformers generate high electrical fields that are able to ionize gases through electrical excitation. This process generates a piezoelectrically ignited micro-plasma with properties that are comparable to a dielectric barrier discharge and as described, for example, in DE 10 2013 100 617 B4, in which a device for generating a plasma with a control circuit is disclosed. The control circuit is electrically connected to a piezoelectric transformer to excite the piezoelectric transformer. A handheld device using the device is also disclosed. The piezoelectric transformer is made up of several layers. The control circuit is implemented on a circuit board and the piezoelectric transformer is held with a region of a first end above the circuit board. A high voltage is applied to a second free end of the piezoelectric transformer, the plasma being generated at atmospheric pressure.

In order to operate an electro-ceramic component, for example a piezoelectric transformer, safely and efficiently, the electro-ceramic component must be reliably contacted and supported in terms of vibration in such a way that the quality of the resonance is reduced as little as possible. In addition, the power loss should be sufficiently dissipated and a possibility must be created to hold, clamp or mount the component.

EP 0814518 B1 discloses a simple outer insulation structure which is intended to partially create the above-mentioned favorable conditions. However, the inadequate heat dissipation and inadequate protection against external mechanical and atmospheric influences on the piezoelectric component have proven to be disadvantageous here. These disadvantages become particularly serious with high gear ratios or with powers that are greater than 1 W.

EP 0847093 A1 proposes a holder which is intended to reduce the stress on the ceramic component by means of a mounting frame with damping elements. In this solution, too, the power loss is not sufficiently dissipated when there is a high power output.

EP 0890999 A1 discloses a carrier structure made of a conductive elastic material, which is intended to resolve the conflict of objectives between the lowest possible mechanical interaction and good electrical connection. However, the negative thermal effects are not eliminated in this solution either.

In EP 1030381 B1, the piezoelectric transformer is attached to a printed circuit board with a permanently elastic material. The mechanical damping is reduced in that a weak mechanical coupling is sought outside of the vibration nodes. Various designs are disclosed for this purpose, which, however, do not allow a good thermal conduction connection. In the embodiment disclosed in FIG. 6, in particular, it turns out to be disadvantageous that the dielectric losses on the high voltage side and the asymmetry lead to a high load on the ceramic component.

It is also known that piezoelectric transformers deliver a very high voltage swing (transmission ratio) and are excellently suited to generate AC voltages with a high amplitude at low cost and with little effort. In addition, such piezoelectric transformers can also be used to ignite a direct electrical gas discharge on the high voltage side. Various technical difficulties arise in all cases, as described below. The mechanical vibration of the electromechanical transducer must neither be strongly damped nor hindered, since otherwise the quality and efficiency of the conversion decrease and the component or the device with the piezoelectric transformer can be damaged. The power loss must also be dissipated from the vibrating component. Furthermore, the excitation part must be securely linked to the excitation signal. In addition, it is desirable that the component or the device with the piezoelectric transformer is protected from environmental influences, such as moisture, dirt, etc., and is decoupled from external mechanical impacts.

Another problem is represented by parasitic discharges which ignite uncontrollably from the high-voltage zone of the electro-ceramic component, for example a piezoelectric transformer, against the housing of the device with the electro-ceramic component or other objects in the vicinity of the device.

DE 10225408 A1, DE 3927406 A1 and DE 102015120160 A1 disclose further devices with electro-ceramic components.

SUMMARY OF THE INVENTION

It is an object of the invention to provide a device with an electro-ceramic component which device is safe to operate and inexpensive to manufacture and has a long service life.

The above object is achieved by a device with an electro-ceramic component, which device comprises a first electrical contact provided on a first side face of the electro-ceramic component and a second electrical contact provided on a second side face of the electro-ceramic component. A sealing compound is placed around the electro-ceramic component so that the first electrical contact and the second electrical contact are covered by the sealing compound and a free three-dimensional end of a section of the electro-ceramic component projects beyond a free end of the sealing compound.

According to an embodiment of the invention, a device with an electro-ceramic component is disclosed. The electro-ceramic component defines an excitation zone and a high-voltage zone. The device comprises a first electrical contact which is provided on a first side face of the electro-ceramic component. A second electrical contact is provided on a second side face of the electro-ceramic component. According to the invention, a sealing compound is applied around the electro-ceramic component so that the first electrical contact and the second electrical contact are covered by the sealing compound and a free end of a section of the electro-ceramic component projects beyond a free end of the sealing compound.

This special arrangement of the sealing compound on the electro-ceramic component, for example on the piezoelectric transformer or on the ceramic transformer, has proven to be particularly advantageous, as will be explained in detail below. To solve the above-mentioned problems, first of all the casting of the component for the device with the electro-ceramic component with a permanently elastic, thermally conductive and electrically insulating sealing compound in a robust housing was considered. Surprisingly, however, it turned out to be problematic that with all known sealing compounds the dielectric losses are so high that the high-voltage zone of the electro-ceramic component heats up very much and the quality of such a device with an electro-ceramic component with regard to the conversion of the AC voltage decreases very sharply. It is therefore not possible to provide a compact sealing for electro-ceramic components as soon as they have a high secondary voltage, for example 10 kV, with a high frequency, for example 100 KHz.

Further experiments have then shown that the problems outlined above can be solved in that a sealing compound should not be applied completely around the electro-ceramic component, for example around the piezoelectric transformer, but only partially so that the first electrical contact and the second electrical contact at the excitation zone are covered by the sealing compound and a free end of a section of the high-voltage zone of the electro-ceramic component projects beyond a free end of the sealing compound. This special arrangement of the sealing compound causes mechanical vibrations to occur in the excitation zone and ohmic losses lead to a certain amount of heat being generated. In the excitation zone, the electric fields are quite low and the electro-ceramic component can be embedded, for example cast, without limiting the invention, in a highly elastic mass. For this purpose, for example, chemically stable and well electrically insulating and permanently elastic materials such as silicone sealing compounds or silicone gel sealing compounds are suitable. If the component is only partially encapsulated, the quality of the device and the amplitude of the output voltage surprisingly decrease only slightly.

According to an embodiment of the invention, the electro-ceramic component is a piezoelectric component. In a preferred embodiment, the piezoelectric component is a piezoelectric transformer.

According to a further embodiment of the invention, the electro-ceramic component is a ceramic capacitor.

According to an embodiment of the invention, at least the excitation zone of the electro-ceramic component, for example the piezoelectric transformer, is completely surrounded by the sealing compound, wherein, for example, electrical lines run through the sealing compound to the two electrical contacts. The contact on the side of the excitation zone is well protected and mechanically decoupled via the encapsulation. The heat can be easily extracted and dissipated, for example via a housing or a heat sink structure. In the embodiment with the housing, the electro-ceramic component, for example the piezoelectric transformer, is embedded in the housing together with the sealing compound in such a way that at least the free end of the electro-ceramic component projects beyond the housing. For decoupling and for dissipating the heat, the housing or the heat sink structure can be made of metal, for example aluminum, or a ceramic. The housing of the device can now also be used for fastening in an assembly without problems. Therefore, according to an embodiment of the invention, at least one fastening element is attached to the housing.

In the area of the high-voltage zone, where high potentials with regard to the AC voltage occur, massive embedding with the sealing compound is dispensed with and the electro-ceramic component hangs mostly freely in the surrounding area. It has been shown that a thin dielectric insulation layer, which, for example, can consist of the same material as the sealing compound, which is relatively voluminous compared to the thin dielectric insulation layer, has only a minor effect on the quality or the losses in the AC voltage. Therefore, according to a further embodiment of the invention, the section of the high-voltage zone is surrounded by a dielectric layer. It is thus possible to protect the component against environmental influences and superficial partial discharges.

According to an embodiment of the invention, a heat sink is provided which is in thermally conductive contact with the sealing compound and serves to dissipate heat from the sealing compound via the heat sink to the surroundings of the device.

Usually, the device also comprises a driver module for operating the electro-ceramic component, for example a piezoelectric transformer, by the driver module applying electrical excitation in a suitable resonance mode via a first electrical connection to the first electrical contact and via a second electrical connection to the second electrical contact of the excitation zone of the electro-ceramic component. According to an embodiment of the invention, the driver module is embedded in the sealing compound together with the first electrical connection to the first electrical contact and the second electrical connection to the second electrical contact. This has the advantage that the driver module is also protected against environmental influences. In addition, this also protects the electrical connection from the driver module to the first and second electrical contact and avoids mechanical stress.

According to an embodiment of the invention, the sealing compound is an electrically insulating and permanently elastic material. In particular, the electrically insulating and permanently elastic material can be a silicone gel without limiting the invention.

According to an embodiment of the invention, a gas discharge can be generated at the free end of the electro-ceramic component, for example a piezoelectric transformer.

According to an embodiment of the invention, an electrical load is connected to the free end of the electro-ceramic component, for example a piezoelectric transformer.

The manufacturing method according to the invention for a device with an electro-ceramic component comprises several steps, as will be described below. First, the electro-ceramic component defines an excitation zone and a high-voltage zone, with a first electrical contact being provided on a first side face of the electro-ceramic component in the excitation zone and a second electrical contact being provided on a second side face of the electro-ceramic component in the excitation zone, as already mentioned above in connection with the device according to the invention described in detail. In a first step, a sealing compound is brought into contact with the electro-ceramic component so that the first electrical contact and the second electrical contact of the excitation zone are covered by the sealing compound and a section of the high-voltage zone of the electro-ceramic component remains free from the sealing compound. In a second step, the sealing compound is cross-linked to a certain extent, so that the sealing compound adopts a permanently elastic property and has an outer regular shape. As already described above in connection with the device according to the invention, the electro-ceramic component can also be a piezoelectric component in the manufacturing method according to the invention, and the piezoelectric component can in particular be a piezoelectric transformer.

According to an embodiment of the manufacturing method, a driver module is embedded in the sealing compound together with a first electrical connection to the first electrical contact and a second electrical connection to the second electrical contact.

In the manufacturing process, the electro-ceramic component, for example a piezoelectric transformer or a ceramic capacitor, is embedded in a housing together with the sealing compound. The sealing compound is preferably brought into a form fit with the housing and at least the free end of the electro-ceramic component projects beyond the housing.

According to an embodiment of the manufacturing method, the electro-ceramic component, for example a piezoelectric transformer or a ceramic capacitor, is positioned with a first and second electrical connection for the first and second electrical contacts in the housing, so that at least the free end of the electro-ceramic component projects beyond the housing and the electro-ceramic component is spaced from walls of the housing. The sealing compound is filled into the housing.

BRIEF DESCRIPTION OF THE DRAWINGS

In the following, exemplary embodiments are intended to explain the invention and its advantages in more detail with reference to the accompanying figures. The size relationships in the figures do not always correspond to the real size relationships, since some shapes are simplified and other shapes are shown enlarged in relation to other elements for better illustration. Reference is made to the accompanying drawings in which:

FIG. 1 shows a schematic view of an embodiment of the device according to the invention with an electro-ceramic component, the device comprising a housing;

FIG. 2 shows an enlarged, schematic view of the front part of the device according to FIG. 1, a plasma being ignited;

FIG. 3 shows a schematic cross-sectional view through the device according to FIG. 1;

DETAILED DESCRIPTION OF EMBODIMENTS OF THE INVENTION

Figure 4:
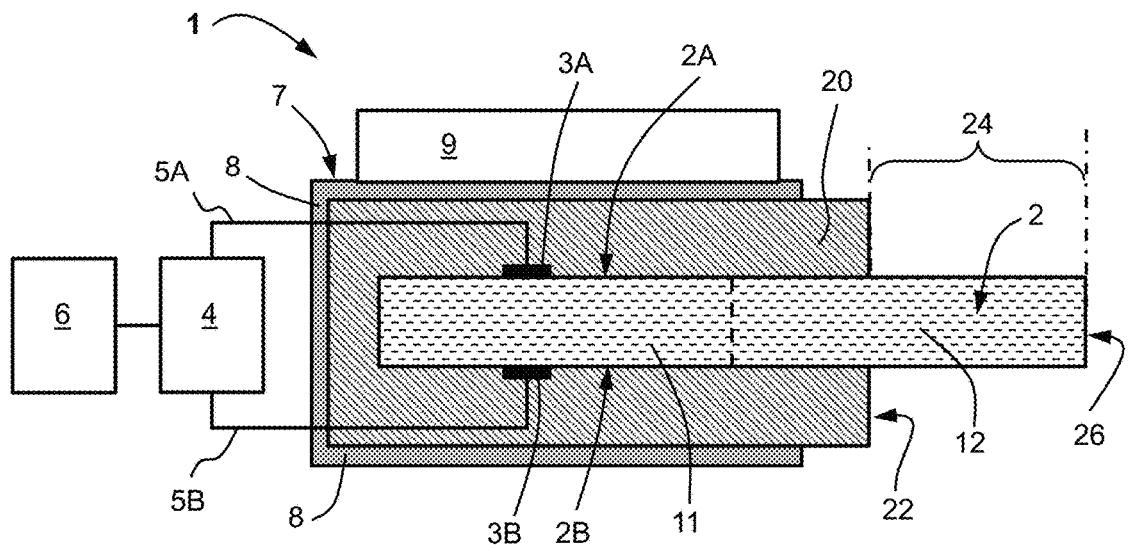
FIG. 4 shows an embodiment of the device according to the invention with the electro-ceramic component.

Identical reference numerals are used for identical or identically acting elements of the invention. Furthermore, for the sake of clarity, only reference numerals are shown in the individual figures which are necessary for the description of the respective figures.

In the following, FIGS. 1 to 3 are described below. FIG. 1 shows a schematic view of an embodiment of the device 1 according to the invention with an electro-ceramic component 2. FIG. 2 shows an enlarged, schematic view of the front part of device 1 according to FIG. 1, a plasma 15 being ignited. FIG. 3 shows a schematic cross-sectional view through the device 1 according to FIG. 1.

In FIG. 1, in particular, the exterior of the device 1 is shown in a plan view. The device 1 according to the invention comprises an electro-ceramic component 2 which defines an excitation zone 11 (see FIG. 3) and a high-voltage zone 12 (see FIGS. 1 to 3). The excitation zone 11 is, however, covered by a housing 7 in the view according to FIG. 1. The device 1 comprises a first electrical contact 3A, which is provided on a first side face 2A of the electro-ceramic component 2 in the excitation zone 11, and a second electrical contact 3B, which is provided on a second side face 2B of the electro-ceramic component 2 in the excitation zone 11. According to the invention, a sealing compound 20 is mounted around the electro-ceramic component 2 so that the first electrical contact 3A and the second electric contact 3B of the excitation zone 11 are covered by the sealing compound 20, and a free end 26 of a section 24 of the high-voltage zone 12 of the electro-ceramic component 2 projects beyond a free end 22 of the sealing compound 20. As outlined above, this special arrangement of the sealing compound 20 on the electro-ceramic component 2 has proven to be particularly advantageous. Mechanical vibrations occur in the excitation zone 11 and ohmic losses lead to a certain amount of heat being generated. In the excitation zone 11, the electric fields are quite low and the electro-ceramic component 2 can be embedded, for example cast, in a highly elastic mass 20, without limiting the invention thereto. For this purpose, for example, chemically stable and well electrically insulating and permanently elastic materials, such as silicone sealing compounds or silicone gel sealing compounds, are suitable. If the electro-ceramic component 2 is only partially encapsulated, as shown in FIGS. 1 to 3, the quality of the device 1 and the amplitude of the output voltage surprisingly only decrease slightly.

In the embodiment according to FIGS. 1 to 3, at least the excitation zone 11 of the electro-ceramic component 2 is completely surrounded by the sealing compound 20 and a housing 7 is provided. The electro-ceramic component 2 is embedded in the housing 7 together with the sealing compound 20 in such a way that at least the free end 26 of the electro-ceramic component 2 projects beyond the housing 7.

The housing 7 can, for example, without limiting the invention, be formed from a metal or a ceramic.

The electro-ceramic component 2 can be a piezoelectric component and in particular a piezoelectric transformer, as also shown in FIGS. 1 to 3.

In the embodiment according to FIGS. 1 to 3, the device 1 further comprises at least one fastening element 13 which is attached to the housing 7. In particular, two fastening elements 13 are shown here, without limiting the invention. The housing 7 of the device 1 can thus be used for fastening in an assembly without any problems. As can be seen from FIG. 3, the housing 7 can be provided with a rear mounting plate 18. The housing 7 can be fastened to a structure (not shown) by means of the rear mounting plate 18.

The device 1 further comprises a driver module 4 for operating the electro-ceramic component 2, for example a piezoelectric transformer 2, in that the driver module 4 applies an electrical excitation in a suitable resonance mode of the excitation zone 11 of the electro-ceramic component 2 (piezoelectric transformer). For this purpose, the driver module 4 is connected to a first electrical connection 5A to the first electrical contact 3A and a second electrical connection 5B to the second electrical contact 3B. The driver module 4 can be provided with a plug 10 via which a connection to a power supply 6 is made possible. In the embodiment according to FIGS. 1 to 3, a section of each of the electrical connections 5A, 5B in the direction of the electrical contacts 3A, 3B is embedded in the sealing compound 20, whereas a different section of each of the electrical connections 5A, 5B in the direction of the driver module 4 is not is embedded in the sealing compound 20. Accordingly, the driver module 4 is not embedded in the sealing compound 20 either. If a relatively low voltage is now applied by means of the driver module 4 via the electrical connections 5A, 5B to the electrical contacts 3A, 3B at the excitation zone 11 of the electro-ceramic component (piezoelectric transformer) 2, this ultimately generates a high voltage in the high-voltage zone 12 by means of the known mode of operation of the electro-ceramic component (piezoelectric transformer) 2. The high voltage generates a gas discharge 15 at the free end 26 of the electro-ceramic component (piezoelectric transformer) 2, which gas discharge can be used, for example, to treat a surface with a plasma.

In one embodiment of the manufacturing method according to the invention for a device 1 with an electro-ceramic component 2, for example a piezoelectric transformer 2, in a first step a sealing compound 20 is brought into contact with the electro-ceramic component 2, so that the first electrical contact 3A and the second electrical contact 3B of the excitation zone 11 are covered by the sealing compound 20 and a section 24 of the high-voltage zone 12 of the electro-ceramic component 2 remains free of the sealing compound 20. In a second step, the sealing compound 20 is crosslinked to a certain extent, so that the sealing compound 20 adopts a permanently elastic property and has an outer regular shape. In a further embodiment of the manufacturing method according to the invention, the electro-ceramic component 2, for example a piezoelectric transformer 2, together with the sealing compound 20 are embedded in the housing 7, the sealing compound 20 being brought into a form fit with the housing 7 and at least the free end 26 of the electro-ceramic component 2 protrudes beyond the housing 7. In yet another embodiment of the manufacturing method according to the invention, the electro-ceramic component 2, for example the piezoelectric transformer 2, is positioned with a first and second electrical connection 5A, 5B for the first and second electrical contacts 3A, 3B in the housing 7 so that at least the free end 26 of the electro-ceramic component 2 projects beyond the housing 7, and the electro-ceramic component 2 is spaced from walls 8 of the housing 7, and the sealing compound 20 is filled into the housing 7.

FIG. 4 shows another possible embodiment of the device 1 according to the invention with the electro-ceramic component 2, for example a piezoelectric transformer 2, wherein a heat sink 9 is also provided here which is in a thermally conductive contact with the sealing compound 20 or via the housing 7 with the sealing compound 20 and serves to dissipate heat from the sealing compound 20 via the heat sink 9 to the surroundings of the device 1. All other elements are described in detail in connection with FIGS. 1 to 3.

Figure 5:
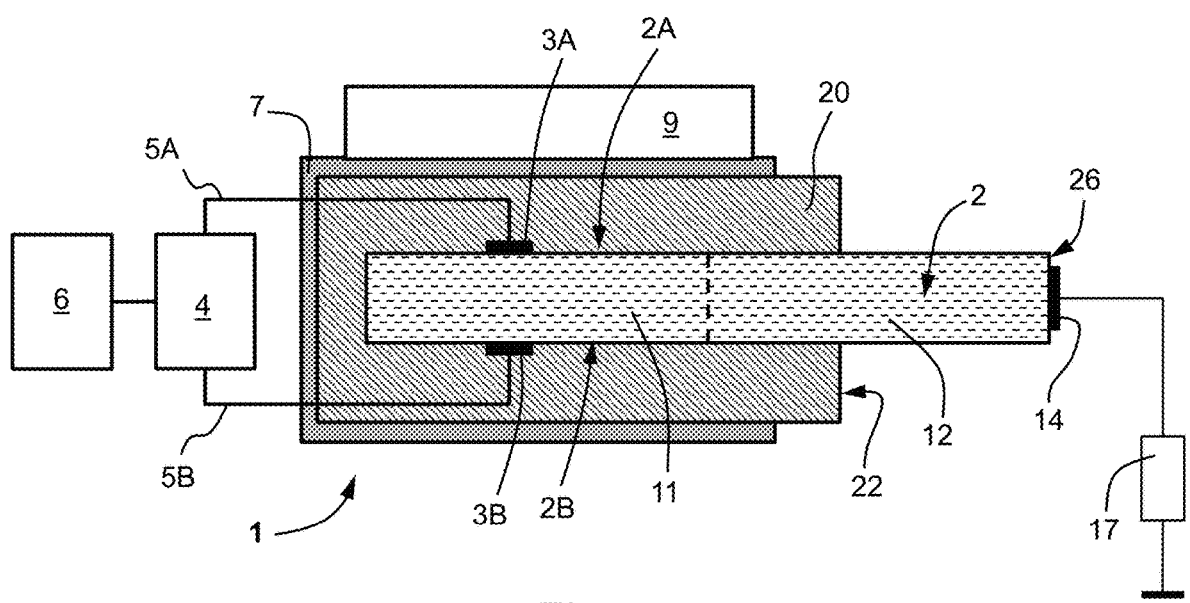
FIG. 5 shows another embodiment of the device according to the invention with the electro-ceramic component.

FIG. 5 shows a further possible embodiment of the device 1 according to the invention with the electro-ceramic component 2, for example a piezoelectric transformer 2, as in FIG. 4 also with a heat sink 9. In addition, the free end 26 of the electro-ceramic component 2 (piezoelectric transformer 2) is connected to an electrical load 17 via a potential tap 14, which uses the high voltage generated in the high-voltage zone 12 of the electro-ceramic component 2 (piezoelectric transformer 2). All other elements of FIG. 5 are described in detail in connection with FIGS. 1 to 3.

Figure 6:
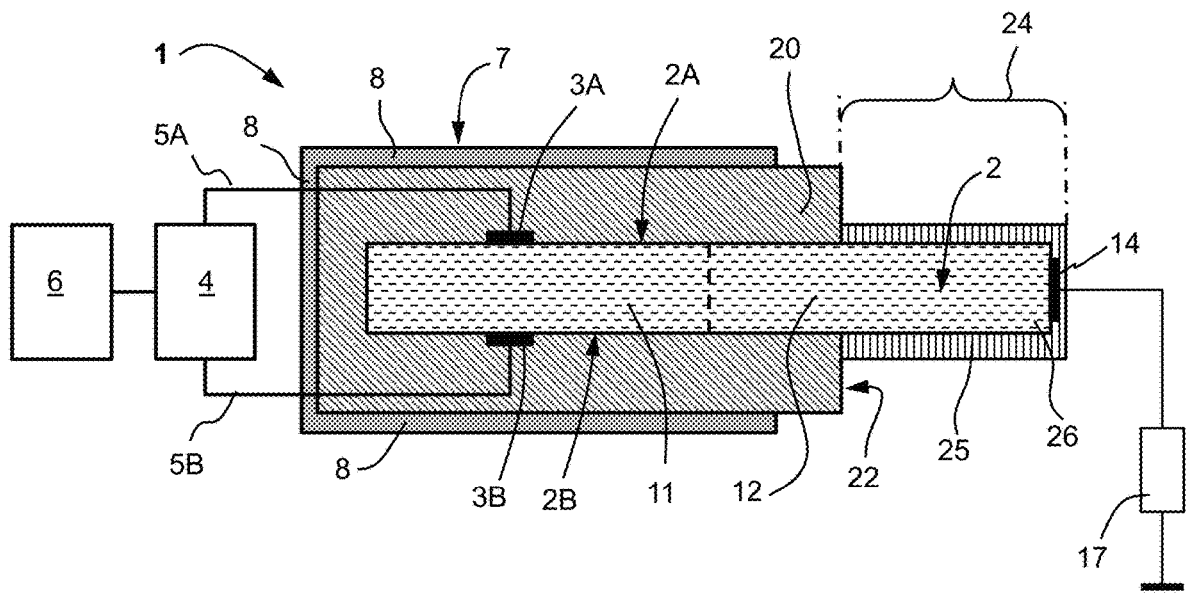
FIG. 6 shows another embodiment of the device according to the invention with the electro-ceramic component.

FIG. 6 shows another possible embodiment of the device 1 according to the invention with the electro-ceramic component 2, for example a piezoelectric transformer 2, also with an electrical load 17 as in FIG. 5. In addition, the section 24 of the high-voltage zone 12 is surrounded by a dielectric layer 25 in order to protect the, apart from the dielectric layer 25, free section 24 with the corresponding section of the high-voltage zone 12 against environmental influences and superficial partial discharges. Likewise, in one embodiment, the potential tap 14 is embedded in the dielectric layer 25. All other elements of FIG. 6 are described in detail in connection with FIGS. 1 to 3.

Figure 7:
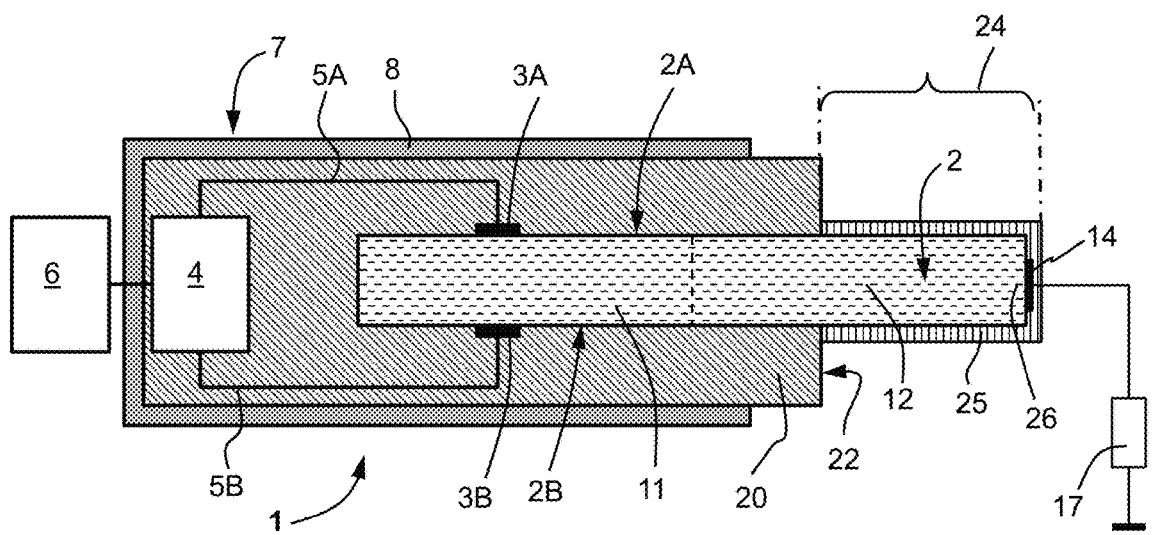
FIG. 7 shows yet another embodiment of the device according to the invention with the electro-ceramic component.

FIG. 7 shows yet another possible embodiment of the device 1 according to the invention with the electro-ceramic component 2, for example a piezoelectric transformer 2, also with an electrical load 17 as in FIG. 5 and with a dielectric layer 25 as in FIG. 6. Here, too, the potential tap 14 is embedded in the dielectric layer 25. In addition and in contrast to the previous embodiments, in FIG. 7, the driver module 4 is embedded in the sealing compound 20 together with the electrical connections 5A, 5B to the respective electrical contacts 3A, 3B. This embodiment offers optimal protection of the driver module 4 and the electrical connections 5A, 5B connected thereto against possible mechanical damage and against environmental influences. In a corresponding embodiment of the manufacturing method according to the invention, the driver module 4 is embedded in the sealing compound 20 together with the first electrical connection 5A to the first electrical contact 3A and the second electrical connection 5B to the second electrical contact 3B.

All other elements of FIG. 7 are described in detail in connection with FIGS. 1 to 3.

Figure 8:
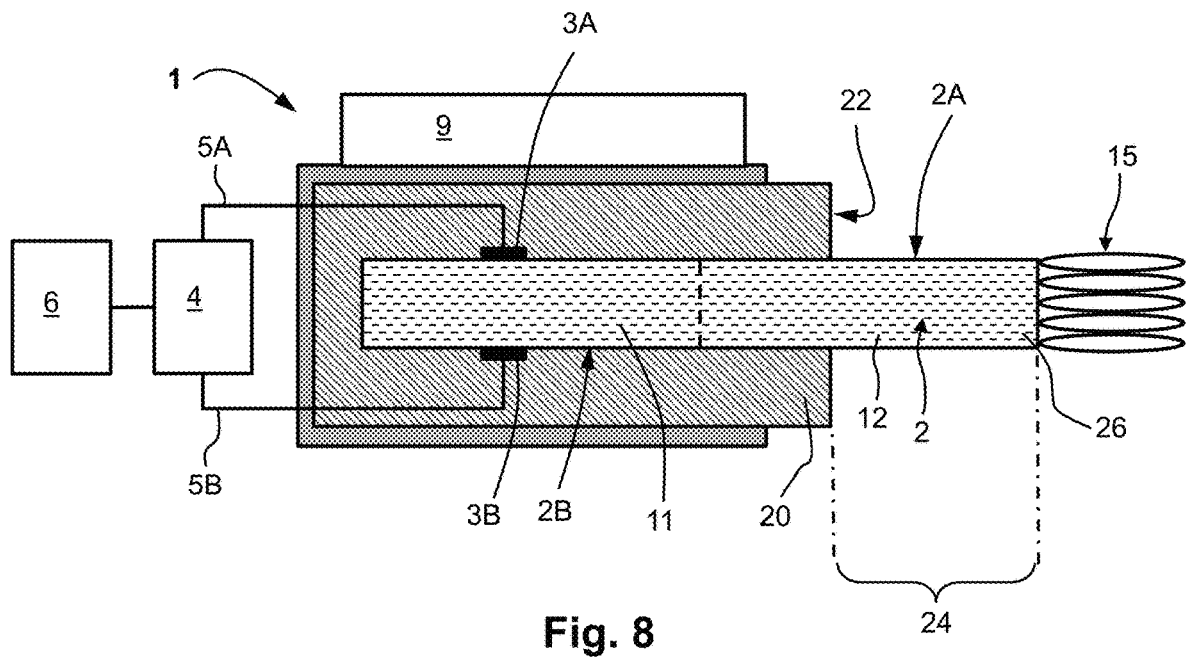
FIG. 8 shows the embodiment of the device according to the invention according to FIG. 4 in operation.

FIG. 8 shows the device 1 according to FIG. 4 in operation when a relatively low voltage at the electrical contacts 3A, 3B at the excitation zone 11 generates a high AC voltage in the high-voltage zone 12, which in turn produces a plasma or a gas discharge 15 at the free end 26 causes, as also already described in detail in connection with FIGS. 1 to 3. All other elements of FIG. 8 are described in detail in connection with FIGS. 1 to 4.

In all drawings, a piezoelectric transformer was described as the electro-ceramic component 2, but this should not be interpreted as a limitation of the invention, since the electroceramic component 2 can also be a different type of electro-ceramic component, for example a piezoceramic, which shows a charge separation when being subjected to deformation by an external force or in which a deformation is caused by applying an electrical voltage and the resulting charge formation (inverse piezoelectric effect). The electro-ceramic component 2 can be made of lead zirconate titanate (LZT), for example. The electro-ceramic component 2 can also be designed as a ceramic capacitor.

Figure 9:
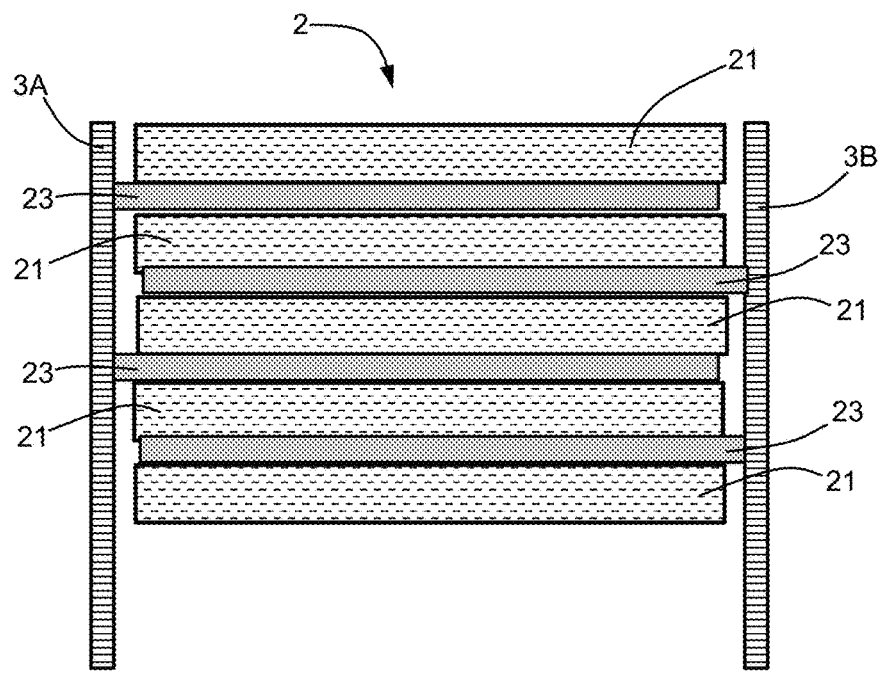
FIG. 9 shows the schematic structure of a ceramic capacitor.

FIG. 9 schematically shows the structure of the electro-ceramic component 2, which is designed in the form of a ceramic capacitor. The ceramic capacitor consists of several layers 21 of a piezoceramic, each of which is separated from one another by a conductive layer 23. The conductive layers 23 are alternately conductively connected to the first electrical contact 3A and the second electrical contact 3B.

Figure 10:
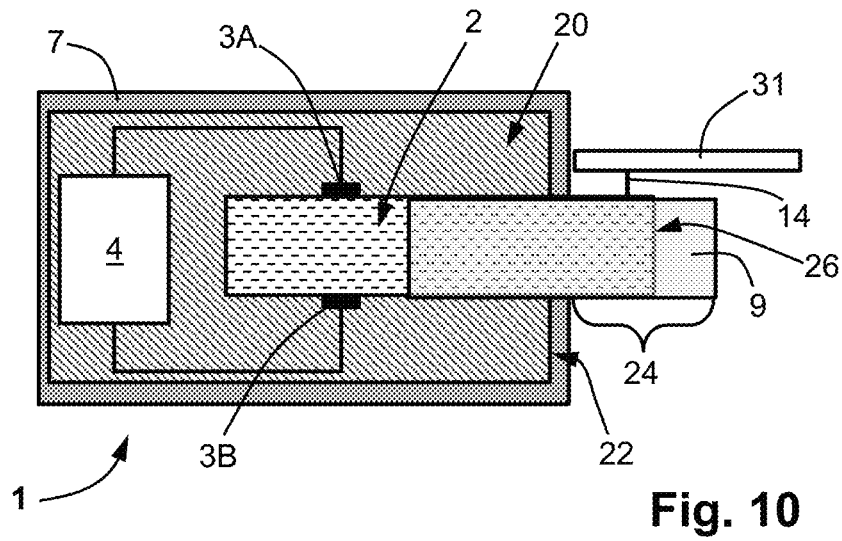
FIG. 10 shows an embodiment of the device according to the invention with the ceramic capacitor.

FIG. 10 shows a further possible embodiment of the device 1 according to the invention with the electro-ceramic component 2, which is designed here as a ceramic capacitor. A heat sink 9 can be assigned to the ceramic capacitor. In addition, the electro-ceramic component 2 (ceramic capacitor 2) can be connected, via a tap 14, to a further electronic component, for example a printed circuit 31, a chip, or other electronic components. In the embodiment shown here, sealing compound 20 is applied around the electro-ceramic component 2 in such a way that the first electrical contact 3A and the second electrical contact 3B are covered by the sealing compound 20. A free end 26 of the section 24 of the electro-ceramic component 2 projects beyond a free end 22 of the sealing compound 20. In the embodiment shown here, the electro-ceramic component 2 together with the sealing compound 20 is embedded in a housing 7 in such a way that at least the free end 26 of the electro-ceramic component 2 protrudes beyond the housing 7. A driver module 4 can be embedded in the sealing compound 20.

Figure 11:
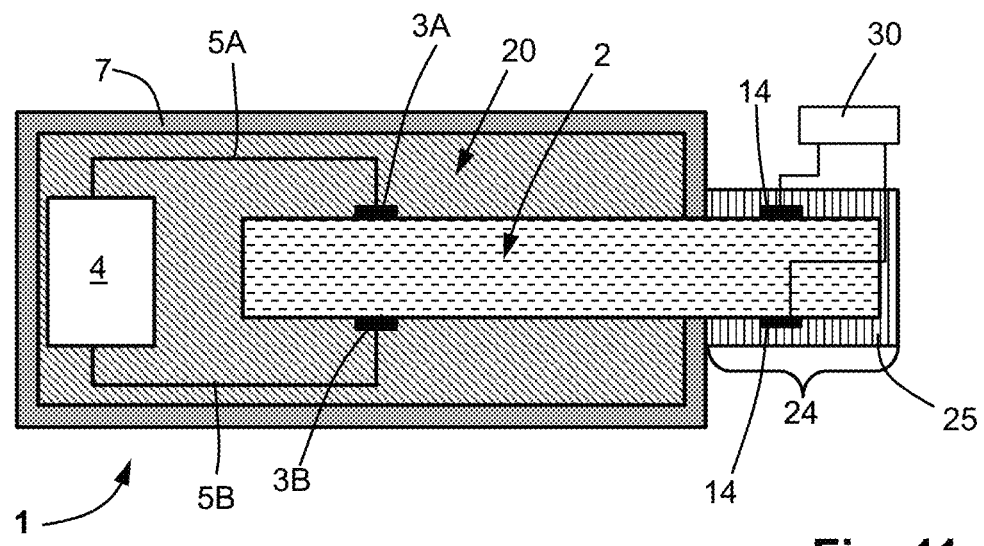
FIG. 11 shows an embodiment of the device according to the invention with the ceramic capacitor.

FIG. 11 shows yet another possible embodiment of the device 1 according to the invention with the electro-ceramic component 2, for example a ceramic capacitor 2. The section 24 can be coated with a dielectric layer 25. Here, too, taps 14 for an electronic component 30 are embedded in the dielectric layer 25. In addition, the driver module 4, together with the electrical connections 5A, 5B to the respective electrical contacts 3A, 3B, is embedded in the sealing compound 20. This embodiment offers optimal protection of the driver module 4 and the electrical connections 5A, 5B connected thereto against possible mechanical damage and against environmental influences.

LIST OF REFERENCE NUMBERS

1 Device
2 Electro-ceramic component, piezoelectric component, piezoelectric transformer, ceramic capacitor
2A First side face
2B Second side face
3A First electrical contact
3B Second electrical contact
4 Driver module
5A First electrical connection
5B Second electrical connection
6 Power supply
7 Housing
8 Wall
9 Heat sink (cooling element)
10 Plug
11 Excitation zone
12 High-voltage zone
13 Fastening element
14 Potential tap, tap
15 Gas discharge, plasma
17 Electrical load
18 Rear mounting plate
20 Sealing compound
21 Layer
22 Free end of sealing compound
23 Conductive layer
24 Section
25 Dielectric layer
26 Free three-dimensional end (high-voltage end)
30 Electronic component
31 Printed circuit

What is claimed is:

1. A device with an electro-ceramic component, comprising:
a first electrical contact provided on a first side face of the electroceramic component;
a second electrical contact provided on a second side face of the electro-ceramic component, wherein a sealing compound is placed around the electro-ceramic component so that the first electrical contact and the second electrical contact are covered by the sealing compound and a free three-dimensional end of a section of the electro-ceramic component projects beyond a free end of the sealing compound; and,
a housing, wherein the electroceramic component together with the sealing compound is embedded in the housing in such a way that at least the free three-dimensional end of the electroceramic component projects beyond the housing.

2. The device according to claim 1 wherein the electro-ceramic component is a piezoelectric component.

3. The device according to claim 2 wherein the piezoelectric component is a piezoelectric transformer which defines an excitation zone and a high-voltage zone, the first electrical contact and the second electrical contact are provided in the excitation zone and wherein the free three-dimensional end of the section of the high-voltage zone projects beyond the piezoelectric transformer.

4. The device according to claim 1 wherein the electro-ceramic component is a ceramic capacitor.

5. The device according to claim 1 wherein at least the area of the first electrical contact and the second electrical contact of the electro-ceramic component are completely surrounded by the sealing compound.

6. The device according to claim 1 wherein the housing is formed from a metal or a ceramic.

7. The device according to claim 1, comprising at least one fastening element which is attached to the housing.

8. The device according to claim 1, comprising a heat sink which is in thermally conductive contact with the sealing compound.

9. The device according to claim 1, comprising a driver module which, together with a first electrical connection to the first electrical contact and a second electrical connection to the second electrical contact is embedded in the sealing compound.

10. The device according to claim 1 wherein the sealing compound is an electrically insulating and permanently elastic material.

11. The device according to claim 10 wherein the electrically insulating and permanently elastic material is a silicone gel.

12. The device according to claim 3 wherein a gas discharge can be generated at the free three-dimensional end of the electro-ceramic component.

13. The device according to claim 3 wherein an electrical load is connected to the free three-dimensional end of the electro-ceramic component.

14. The device according to claim 13 wherein the section of the high-voltage zone of the electro-ceramic component is surrounded by a dielectric layer.

15. The device according to claim 4 wherein at least one further electronic component is connected to the free three-dimensional end of the ceramic capacitor.

16. A device with an electro-ceramic component, comprising:
 a first electrical contact provided on a first side face of the electroceramic component; and,
 a second electrical contact provided on a second side face of the electro-ceramic component, wherein a sealing compound is placed around the electro-ceramic component so that the first electrical contact and the second electrical contact are covered by the sealing compound and a free three-dimensional end of a section of the electro-ceramic component projects beyond a free end of the sealing compound,
 wherein the electro-ceramic component is a piezoelectric component, the piezoelectric component is a piezoelectric transformer which defines an excitation zone and a high-voltage zone, the first electrical contact and the second electrical contact are provided in the excitation zone and wherein the free three-dimensional end of the section of the high-voltage zone projects beyond the piezoelectric transformer.

17. A device with an electro-ceramic component, comprising:
 a first electrical contact provided on a first side face of the electroceramic component;
 a second electrical contact provided on a second side face of the electro-ceramic component, wherein a sealing compound is placed around the electro-ceramic component so that the first electrical contact and the second electrical contact are covered by the sealing compound and a free three-dimensional end of a section of the electro-ceramic component projects beyond a free end of the sealing compound; and,
 a heat sink which is in thermally conductive contact with the sealing compound.

18. A device with an electro-ceramic component, comprising:
 a first electrical contact provided on a first side face of the electroceramic component;
 a second electrical contact provided on a second side face of the electro-ceramic component, wherein a sealing compound is placed around the electro-ceramic component so that the first electrical contact and the second electrical contact are covered by the sealing compound and a free three-dimensional end of a section of the electro-ceramic component projects beyond a free end of the sealing compound; and,
 a driver module which, together with a first electrical connection to the first electrical contact and a second electrical connection to the second electrical contact is embedded in the sealing compound.

* * * * *